(12) United States Patent
Lee et al.

(10) Patent No.: US 9,997,604 B2
(45) Date of Patent: Jun. 12, 2018

(54) ELECTRODE CONNECTING STRUCTURE INCLUDING ADHESION LAYER AND ELECTRONIC DEVICE INCLUDING THE SAME

(71) Applicant: Samsung Electronics Co., Ltd., Suwon-si, Gyeonggi-do (KR)

(72) Inventors: Jaeho Lee, Seoul (KR); Changseok Lee, Seoul (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/113,079

(22) PCT Filed: Jan. 20, 2015

(86) PCT No.: PCT/KR2015/000581
§ 371 (c)(1),
(2) Date: Jul. 21, 2016

(87) PCT Pub. No.: WO2015/111898
PCT Pub. Date: Jul. 30, 2015

(65) Prior Publication Data
US 2017/0025508 A1     Jan. 26, 2017

(30) Foreign Application Priority Data
Jan. 21, 2014  (KR) .................. 10-2014-0007473

(51) Int. Cl.
*H01L 29/417* (2006.01)
*H01L 29/78* (2006.01)
(Continued)

(52) U.S. Cl.
CPC .. *H01L 29/41725* (2013.01); *H01L 21/76831* (2013.01); *H01L 21/76844* (2013.01);
(Continued)

(58) Field of Classification Search
CPC ............... H01L 29/41725; H01L 29/78; H01L 21/76831; H01L 21/76844;
(Continued)

(56) References Cited

U.S. PATENT DOCUMENTS

2010/0055388 A1    3/2010  Chen et al.
2010/0258787 A1   10/2010  Chae et al.
(Continued)

OTHER PUBLICATIONS

Chen, Shanshan et al. "Oxidation Resistance of Graphene-Coated Cu and Cu/Ni Alloy." *ACS Nano* 5.2 (2011): 1321-1327.
(Continued)

*Primary Examiner* — Tucker J Wright
(74) *Attorney, Agent, or Firm* — Harness, Dickey & Pierce, P.L.C.

(57) ABSTRACT

Provided are an electrode connecting structure that includes an adhesion layer formed between a graphene layer and a metal layer and an electronic device having the electrode connecting structure. The electrode connecting structure may include an adhesion layer formed of a two-dimensional material provided between the graphene layer and the metal layer. The graphene layer may be a diffusion barrier, and the adhesion layer may stably maintain the interface characteristics of the graphene layer and the metal layer when the metal layer is formed on a surface of the graphene layer.

20 Claims, 2 Drawing Sheets

(51) Int. Cl.
*H01L 23/532* (2006.01)
*H01L 21/768* (2006.01)
*H01L 29/16* (2006.01)
*H01L 23/522* (2006.01)
*H01L 23/485* (2006.01)

(52) U.S. Cl.
CPC .. *H01L 21/76846* (2013.01); *H01L 23/53223* (2013.01); *H01L 23/53238* (2013.01); *H01L 23/53266* (2013.01); *H01L 23/53276* (2013.01); *H01L 29/1606* (2013.01); *H01L 29/417* (2013.01); *H01L 29/78* (2013.01); *H01L 23/485* (2013.01); *H01L 23/5226* (2013.01); *H01L 2924/0002* (2013.01)

(58) Field of Classification Search
CPC ......... H01L 23/53223; H01L 23/53238; H01L 23/53266
See application file for complete search history.

(56) References Cited

U.S. PATENT DOCUMENTS

| | | |
|---|---|---|
| 2011/0006425 A1 | 1/2011 | Wada et al. |
| 2011/0272765 A1 | 11/2011 | Seo et al. |
| 2012/0100660 A1 | 4/2012 | Hagedorn et al. |
| 2013/0009125 A1 | 1/2013 | Park et al. |
| 2013/0015581 A1 | 1/2013 | Wann et al. |
| 2013/0048951 A1 | 2/2013 | Heo et al. |
| 2013/0113102 A1 | 5/2013 | Bao et al. |
| 2014/0008616 A1 | 1/2014 | Geim et al. |
| 2014/0235051 A1 | 8/2014 | Wann et al. |

OTHER PUBLICATIONS

Ding, Feng et al. "The Importance of Strong Carbon-Metal Adhesion for Catalytic Nucleation of Single-Walled Carbon Nanotubes." *Nano Letters* 0.0 (2007): A-F.

Huang, Rui. "Show of adhesive strength: The adhesion energies for atomically thin graphene membranes on silicon dioxide substrates have now been measured." *Nature Nanotechnology* 6 (2011): 537-538.

Jiang, D.E. and Emily A. Carter. "First-principles study of the interfacial adhesion between $SiO_2$ and $MoSi_2$." *Physical Review B* 72 (2005): 165410-1-165410-7.

Zhao, J.L. et al. "Preparation of $MoS_2$/Zr Coated High Speed Steel Tool and Its Cutting Performance." *Advanced Materials Research* 69-70 (2009): 153-157.

Gannett, et al. "Boron nitride substrates for high mobility chemical vapor deposited graphene," Applied Physics Letters, vol. 98, No. 24, pp. 242105-1-242105-3 (2011).

Extended European Search Report dated Jul. 18, 2017 issued in corresponding European Application No. 15740595.2.

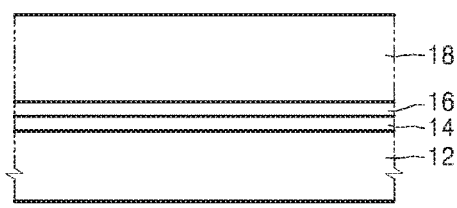
[Fig. 1]
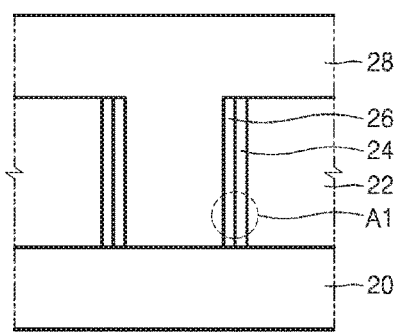
[Fig. 2a]
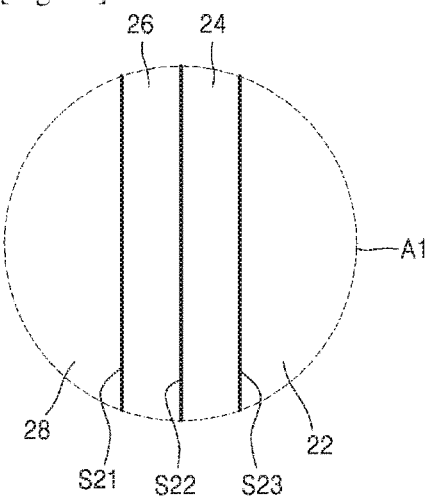
[Fig. 2b]
[Fig. 3a]

[Fig. 3b]
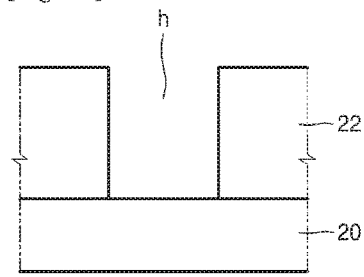
[Fig. 3c]
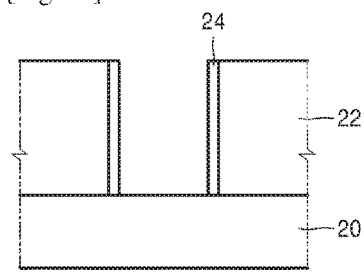
[Fig. 3d]
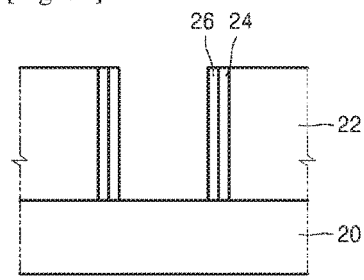
[Fig. 3e]
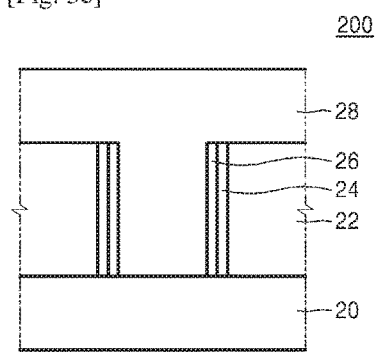
[Fig. 4]
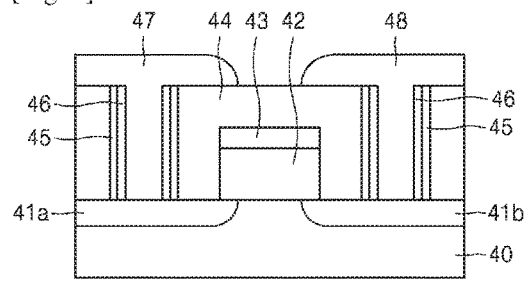

ELECTRODE CONNECTING STRUCTURE INCLUDING ADHESION LAYER AND ELECTRONIC DEVICE INCLUDING THE SAME

TECHNICAL FIELD

The present disclosure relates to an electrode connecting structure including an adhesion layer and an electronic device including the electrode connecting structure.

BACKGROUND ART

An electrode connecting structure of a general electronic device may be formed at a predetermined location of the electronic device in order to supply power to the electronic device or to detect the internal electrical characteristics of the electronic device. As an electrode material for forming an electronic device, a conductive material, such as a highly conductive metal, conductive metal oxide, or conductive metal nitride has been generally used.

Regarding an electrode connecting structure of an electronic device, when a conductive material, for example, copper, is used as an electrode material, a material, such as Ta or TaN is used for forming a diffusion barrier to prevent diffusion of copper outside of the electrode connecting structure or to prevent diffusion of an external material into the electrode connecting structure.

However, according to users' demands, for example, the necessity of integrity and service environment, an electronic device of a reduced size may be required. When the size of the electronic device is reduced, the thickness and width of an electrode connecting structure may also be reduced, and thus, an electrode connecting structure having precise dimensions is needed. For example, in order to connect a source, a drain, or a gate of a transistor to the outside, an electrode connecting structure may be formed by using contact holes, and as the size of the electronic device is reduced, the size of the contact hole may also be reduced. Thus, in the case of an electrode connecting structure that has to be manufactured with high precision, there is a limitation in reducing the thickness of a general diffusion barrier film, and thus, the forming the diffusion barrier film is not easy.

DISCLOSURE OF INVENTION

Technical Problem

Provided are an electrode connecting structure including an adhesion layer and electronic device including the electrode connecting structure.

Additional aspects will be set forth in part in the description which follows and, in part, will be apparent from the description, or may be learned by practice of the presented embodiments.

Solution to Problem

According to an aspect of the present invention, an electrode connecting structure includes an insulating layer, a graphene layer formed on the insulating layer, an adhesion layer formed on the graphene layer, and a metal layer formed on the adhesion layer.

The insulating layer may include an opening that exposes a lower structure, the graphene layer and the adhesion layer are formed on a sidewall of the opening, and the metal layer is electrically connected to the lower structure through the opening.

The adhesion layer may include a metal chalcogenide based material.

The metal chalcogenide based material may include transition metal dichalcogenide (TMDC).

The metal chalcogenide based material may include at least one metal element selected from the group consisting of Mo, W, Nb, V, Ta, Ti, Zr, Hf, Tc, Re, Cu, Ga, In, Sn, Ge, and Pb and at least one chalcogen element selected from the group consisting of S, Se, and Te.

The adhesion layer may include BN.

The lower structure may be a silicon layer.

According to an aspect of the present invention, an electronic device that includes the electrode connecting structure described above is provided.

The electronic device may be a transistor, and the transistor may be a field effect transistor (FET), a thin film transistor (TFT), a binary junction transistor (BJT), or a barrier transistor.

The electronic device may be a diode, a solar cell, a photo-detector, a tunneling device, a memory device, a logic device, a light-emitting device, an energy storage device, or a display device.

According to an aspect of the present invention, an electronic device includes: a substrate, a source and a drain that are formed on the substrate, a gate insulating layer and a gate electrode that are formed on the substrate between the source and the drain; an insulating layer that is formed on the source and the drain and comprises openings that respectively expose the source and the drain; a graphene layer and an adhesion layer that are formed on sidewalls of the openings; and a source electrode and a drain electrode that are formed in the adhesion layer and are respectively electrically connected to the source and the drain.

Advantageous Effects of Invention

According to the present disclosure, when a metal layer is formed on a graphene layer, an adhesion layer is formed of a two-dimensional material between the graphene layer and the metal layer, and thus, an electrode connecting structure having an improved interface characteristic between the graphene layer and the metal layer may be realized. Also, an electronic device having a high characteristic may be provided by forming an electrode connecting structure that includes an adhesion layer formed of a two-dimensional material.

BRIEF DESCRIPTION OF DRAWINGS

These and/or other aspects will become apparent and more readily appreciated from the following description of the embodiments, taken in conjunction with the accompanying drawings in which:

FIG. 1 is a cross-sectional view of an electrode connecting structure according to an embodiment of the present invention;

FIG. 2a is a cross-sectional view of an electrode connecting structure according to other embodiment of the present invention;

FIG. 2b is a magnified view of a region A2 of FIG. 2A;

FIGS. 3a through 3e are cross-sectional views for describing a method of manufacturing an electrode connecting structure according to an embodiment of the present invention; and FIG. 4 is a cross-sectional view of an electronic device having an electrode connecting structure according to an embodiment of the present invention.

MODE FOR THE INVENTION

Reference will now be made in detail to embodiments, examples of which are illustrated in the accompanying drawings. In the drawings, widths and thicknesses of layers and regions are exaggerated for clarity of the specification. Also, like reference numerals refer to like elements throughout. Also, in the layer structures described below, when an element is referred to as being "on" or "above" another element, it may be directly on or intervening elements may also be present.

FIG. 1 is a cross-sectional view of an electrode connecting structure 100 according to an embodiment of the present invention.

Referring to FIG. 1, the electrode connecting structure 100 may include an insulating layer 12, a graphene layer 14 and a metal layer 18 that are formed on the insulating layer 12, and an adhesion layer 16 that may be formed between the graphene layer 14 and the metal layer 18.

Graphene in the composition of the graphene layer 14 is a chemically stable material and a gas or a liquid may not easily penetrate therethrough. Graphene has a single-atom layer structure including carbon atoms that form a hexagonal structure. When the metal layer 18 is formed on the graphene layer 14, diffusion of a constituent material of the metal layer 18 into the insulating layer 12 and diffusion of a material in the composition of the insulating layer 12 into the metal layer 18 may be effectively prevented. However, since graphene of the graphene layer 14 may not have a high adhesion characteristic with a metal material in the composition of the metal layer 18, when the graphene layer 14 directly contacts the metal layer 18, exfoliation of the metal layer 18 may occur. Accordingly, in the electrode connecting structure 100 according to the current embodiment, the adhesion layer 16 may be formed between the graphene layer 14 and the metal layer 18, and thus, an interface characteristic of each of the graphene layer 14 and the metal layer 18 may be stable.

The adhesion layer 16 may be formed of a two-dimensional material. The two-dimensional material may have a single-layer or a half-layer structure in which atoms form a predetermined crystal structure. However, the two-dimensional material is not limited thereto and may have a multiple-layer structure. The two-dimensional material may include a metal chalcogenide based material. The metal chalcogenide based material may be transition metal dichalcogenide (TMDC) that includes a transition metal and chalcogen. The transition metal may be at least one selected from the group consisting of Mo, W, Nb, V, Ta, Ti, Zr, Hf, Tc, and Re, and the chalcogen may be at least one selected from the group consisting of S, Se, and Te. Here, the TMDC material may be expressed as chemical formula of $MX_2$. X may be a chalcogen element. M may be a transition metal, such as Mo, W, Nb, V, Ta, Ti, Zr, Hf, Tc, or Re, and X may be a chalcogen element, such as S, Se, or Te. More specifically, TMDC may be $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, or $ReSe_2$. Also, the metal chalcogenide based material may not be expressed as $MX_2$. For example, a transition metal dichalcogenide material, such as a compound of Cu which is a transition metal and S which is a chalcogen element may be expressed as CuS.

Also, the adhesion layer 16 may be formed of a metal dichalcogenide material that includes a non-transition metal, and the non-transition metal may be, for example, Ga, In, Sn, Ge, or Pb. The adhesion layer 16 may be formed of a metal chalcogenide based material that includes a compound of a non-transition metal, such as Ga, In, Sn, Ge, or Pb and a chalcogen element, such as S, Se, and Te. More specifically, a chalcogenide material that includes a non-transition metal may be, for example, $SnSe_2$, GaS, GaSe, GaTe, GeSe, $In_2Se_3$, and $InSnS_2$.

In summary, the adhesion layer 16 may be formed of a metal chalcogenide based material, that is, may be formed by including at least one metal element selected from the group consisting of Mo, W, Nb, V, Ta, Ti, Zr, Hf, Tc, Re, Cu, Ga, In, Sn, Ge, and Pb and at least one chalcogen element selected from the group consisting of S, Se, and Te. However, these materials are just examples, and thus, the adhesion layer 16 may be formed of other materials too. For example, a material, such as BN may be included in the adhesion layer 16.

The electrical characteristics of the adhesion layer 16 are not limited. That is, the adhesion layer 16 may have a non-conductivity characteristic, a semiconductor characteristic, or a conductive characteristic. The adhesion layer 16 may have a p-type semiconductor characteristic or an n-type semiconductor characteristic. The adhesion layer 16 may be formed of a metal chalcogenide based material having an n-type semiconductor characteristic, and may include at least one of, for example, $MoS_2$, $MoSe_2$, $MoTe_2$, $WSe_2$, and $WTe_2$. Also, the adhesion layer 16 may be formed of a metal chalcogenide based material having a p-type semiconductor characteristic, and may include at least one of, for example, $WS_2$, $ZrS_2$, $ZrSe_2$, $HfS_2$, $HfSe_2$, and $NbSe_2$. Also, the adhesion layer 16 may be doped with a p-type dopant or an n-type dopant. The p-type dopant and the n-type dopant may be various dopant materials, and there are no specific limitations. The adhesion layer 16 may be doped with the p-type dopant or the n-type dopant by using an ion implantation process or a chemical doping process.

The insulating layer 12 may be formed of a material having a low electrical conductivity, and may include a material that is used as an interlayer dielectric (ILD) film. The insulating layer 12 may include silicon oxide $SiO_2$ or a high-k material having a dielectric constant higher than that of silicon oxide $SiO_2$. The insulating layer 12 may be formed of, for example, silicon nitride, hafnium oxide, aluminum oxide, tungsten oxide, tantalum oxide, titanium oxide, or ruthenium oxide. Also, the insulating layer 12 may be formed of an insulating polymer.

The metal layer 18 may be formed of a conductive material, and may include a metal, a conductive metal oxide, or a conductive metal nitride. For example, the metal layer 18 may be formed of a metal, such as Cu, Ag, Au, Al, Pt, Ti, W, Ru, Ta or an alloy of these metals.

The electrode connecting structure 100 of FIG. 1, according to an embodiment of the present invention, may be connected to various types of structures. For example, the electrode connecting structure 100 may be formed on a lower structure, and the lower structure may be an electronic device having various structures or a silicon Si layer that is used as a substrate of an electronic device. The electronic device may be a transistor having various structures, and the transistor may be, for example, a FET, a TFT, a BJT, or a barrier transistor. Also, the electronic device may be various electronic devices, for example, a diode, a solar cell, a photodetector, a tunneling device, a memory device, a logic device, a light-emitting device, an energy storage device, or a display device.

FIG. 2a is a cross-sectional view of an electrode connecting structure according to other embodiment of the present invention. FIG. 2b is a magnified view of a region A2 of FIG. 2a.

Referring to FIGS. 2a and 2b, an electrode connecting structure 200 according to the other embodiment of the present invention may include a lower structure 20, an insulating layer 22 formed on the lower structure 20, and a metal layer 28 that is electrically connected to the lower structure 20 through an opening of the insulating layer 22. A graphene layer 24 and an adhesion layer 26 may be formed between the insulating layer 22 and the metal layer 28. The adhesion layer 26 formed in the opening of the insulating layer 22 may have a width smaller than that of the metal layer 28. The adhesion layer 26 may have a multiple-layer structure, and may have a first interface S21 with the metal layer 28 and a second interface S22 with the graphene layer 24. Also, the graphene layer 24 may have a third interface S23 with the insulating layer 22. Since the adhesion layer 26 is formed between the graphene layer 24 and the metal layer 28, the first and second interfaces S21 and S22 may have a stable adhesion characteristic without undergoing exfoliation. That is, in the electrode connecting structure 200 according to the current embodiment, an interface characteristic of each of the first and second interfaces S21 and S22 may be stably maintained by forming the adhesion layer 26 between the graphene layer 24 and the metal layer 28.

In the electrode connecting structure 200 according to the current embodiment, the graphene layer 24 may function as a diffusion barrier, and the adhesion layer 26 may increase the adhesion between the graphene layer 24 and the metal layer 28. The descriptions presented with reference to FIG. 1 with regard to the materials for forming each of the layers and the electrical characteristics thereof may be applied to the lower structure 20, the insulating layer 22, the graphene layer 24, the adhesion layer 26, and the metal layer 28 shown in FIG. 2a.

FIGS. 3a through 3e are cross-sectional views for describing a method of manufacturing an electrode connecting structure according to an embodiment of the present invention. In FIGS. 3a through 3e, a method of manufacturing the electrode connecting structure 200 of FIG. 2a is described. However, the same method may be used to manufacture the electrode connecting structure 100 of FIG. 1.

Referring to FIG. 3a, the insulating layer 22 is formed on the lower structure 20. The lower structure 20 may be formed of silicon, and may be an electronic device having various structures. The insulating layer 22 may be formed on a conductive layer of the electronic device. The electronic device may be a transistor having various structures, and the transistor may be, for example, a FET, a TFT, a BJT, or a barrier transistor. The electronic device may be one of various electronic devices, for example, a diode, a solar cell, a photo-detector, a tunneling device, a memory device, a logic device, a light-emitting device, an energy storage device, or a display device.

The insulating layer 22 may be formed of a material that is generally used as an ILD in an electronic device, such as a semiconductor device. For example, the insulating layer 22 may include silicon oxide $SiO_2$ or a high-k material having a dielectric constant higher than that of silicon oxide $SiO_2$. The insulating layer 12 may be formed of, for example, silicon nitride, hafnium oxide, aluminum oxide, tungsten oxide, tantalum oxide, titanium oxide, or ruthenium oxide. Also, the insulating layer 12 may be formed of an insulating polymer. The insulating layer 22 may be formed by using a chemical vapor deposition method, a physical vapor deposition method, an atomic layer deposition method, or a spin coating method.

Referring to FIG. 3b, an opening h that exposes the lower structure 20 is formed in the insulating layer 22 by using an etching process. The shape of the opening h is not specifically limited, and may be a hole shape.

Referring to FIG. 3c, the graphene layer 24 may be formed on a sidewall of the insulating layer 22 in the opening h. The graphene layer 24 may be formed by using, for example, a chemical vapor deposition (CVD) method.

Referring to FIG. 3d, the adhesion layer 26 may be formed on a surface of the graphene layer 24 in the opening h. The adhesion layer 26 may be formed of a metal chalcogenide based material including at least one metal element selected from the group consisting of Mo, W, Nb, V, Ta, Ti, Zr, Hf, Tc, Re, Cu, Ga, In, Sn, Ge, and Pb and at least one chalcogen element selected from the group consisting of S, Se, and Te. Also, the adhesion layer 26 may be formed of a material such as BN.

Referring to FIG. 3e, the metal layer 28 is formed by depositing a metal material on the lower structure 20 that is exposed through the opening h, and thus, the manufacture of the electrode connecting structure 200 is completed. Additionally, an annealing process may be further performed according to the material used to form the electrode connecting structure 200.

FIG. 4 is a cross-sectional view of an electronic device having an electrode connecting structure according to an embodiment of the present invention. As an example, the electronic device of FIG. 4 is a transistor and the electrode connecting structure is connected to a source 41a and a drain 41b of the transistor.

Referring to FIG. 4, the source 41a and the drain 41b are formed on a substrate 40, and a gate insulating layer 42 and a gate electrode 43 are formed on the substrate 40 between the source 41a and the drain 41b. An insulating layer 44 may be formed on the source 41a and the drain 41b, and openings that respectively expose the source 41a and the drain 41b may be formed in the insulating layer 44. A graphene layer 45 and an adhesion layer 46 may be formed on sidewalls of each of the openings of the insulating layer 44. Also, a source electrode 47 and a drain electrode 48 that are respectively electrically connected to the source 41a and the drain 41b may be formed inside the adhesion layer 46.

The substrate 40 of the transistor of FIG. 4 may be formed of a substrate material, such as silicon that is generally used in semiconductor devices. The source 41a and the drain 41b respectively may be formed by doping an n-type dopant or a p-type dopant in the substrate 40. The gate insulating layer 42 may be formed of a dielectric material, such as silicon oxide, silicon nitride, aluminum oxide, or hafnium oxide. The gate electrode 43 may be formed of a conductive material, such as a metal, an alloy, a conductive metal oxide, or a conductive metal nitride. The source electrode 47 and the drain electrode 48 may be formed of a conductive material, such as a metal, an alloy, a conductive metal oxide, or a conductive metal nitride. To form the insulating layer 44, the graphene layer 45, and the adhesion layer 46, the same methods of forming the insulating layer 22, the graphene layer 24, and the adhesion layer 26 of FIG. 2A respectively may be applied.

FIG. 4 presents an example when the electronic device that includes the electrode connecting structure according to the current embodiment is a thin film transistor. However, the electronic device that includes the electrode connecting structure according to the current embodiment is not limited to the thin film transistor, and may be an electronic device of various types. In the electrode connecting structure of the electronic device, an adhesion layer may be included between a graphene layer and a metal layer.

According to the current invention, when a metal layer is formed on a graphene layer, an adhesion layer is formed of a two-dimensional material between the graphene layer and the metal layer, and thus, an electrode connecting structure having an improved interface characteristic between the graphene layer and the metal layer may be realized. Also, an electronic device having a high characteristic may be provided by forming an electrode connecting structure that includes an adhesion layer formed of a two-dimensional material.

While one or more embodiments of the present invention have been described with reference to the figures, it will be understood by those of ordinary skill in the art that various changes in form and details may be made therein without departing from the spirit and scope of the present invention as defined by the following claims.

The invention claimed is:

1. An electrode connecting structure comprising:
   an insulating layer defining an opening, the opening having a width defined based on a space between a first sidewall of the insulating layer and a second sidewall of the insulating layer;
   a graphene layer in the opening, the graphene layer extending along the first sidewall of the insulating layer in the opening, the graphene layer extending along the second sidewall of the insulating layer in the opening;
   an adhesion layer in the opening, the adhesion layer extending along the graphene layer in the opening, the adhesion layer including a two-dimensional material; and
   a metal layer in the opening, the metal layer arranged so the graphene layer and the adhesion layer are between the metal layer and the first sidewall of the insulating layer in the opening, the metal layer arranged so the graphene layer and the adhesion layer are between the metal layer and the second sidewall of the insulating layer in the opening.

2. The electrode connecting structure of claim 1, further comprising:
   a lower structure, wherein
   the opening of the insulating layer exposes the lower structure, and
   the metal layer is electrically connected to the lower structure through the opening.

3. The electrode of claim 2, wherein
   the graphene layer defines a hole that exposes a top surface of the lower structure, and
   the metal layer is directly connected to the top surface of the lower structure through the hole of the graphene layer.

4. The electrode connecting structure of claim 1, wherein the adhesion layer comprises BN.

5. The electrode connecting structure of claim 1, further comprising:
   a lower structure, wherein
   the insulating layer is on the lower structure, and
   the lower structure is a silicon layer.

6. An electronic device comprising the electrode connecting structure of claim 1.

7. The electronic device of claim 6, wherein the electronic device is a transistor, and the transistor is a field effect transistor (FET), a thin film transistor (TFT), a binary junction transistor (BJT), or a barrier transistor.

8. The electronic device of claim 6, wherein the electronic device is a diode, a solar cell, a photodetector, a tunneling device, a memory device, a logic device, a light-emitting device, an energy storage device, or a display device.

9. The electrode connecting structure of claim 1, wherein a portion of the metal layer is on top of the graphene layer.

10. The electrode connecting structure of claim 1, wherein a portion of the metal layer is on top of the adhesion layer.

11. The electrode connecting structure of claim 1, further comprising:
    a lower structure, wherein
    the insulating layer is on the lower structure,
    the opening of the insulating layer exposes the lower structure, and
    the adhesion layer extends in a vertical direction relative to a top surface of the lower structure.

12. The electrode connecting structure of claim 1, further comprising:
    a lower structure, wherein
    the insulating layer is on the lower structure,
    the opening of the insulating layer exposed the lower structure, and
    the graphene layer extends in a vertical direction relative to a top surface of the lower structure.

13. The electrode connecting structure of claim 1, wherein
    the graphene layer surrounds the adhesion layer in the opening, and
    the adhesion layer surrounds the metal layer in the opening.

14. The electrode of claim 1, wherein the adhesion layer includes metal chalcogenide based material.

15. An electrode connecting structure comprising:
    an insulating layer;
    a graphene layer formed on the insulating layer;
    an adhesion layer formed on the graphene layer; and
    a metal layer formed on the adhesion layer, wherein
    the adhesion layer comprises a metal chalcogenide based material.

16. The electrode connecting structure of claim 15, wherein the metal chalcogenide based material comprises transition metal dichalcogenide (TMDC).

17. The electrode connecting structure of claim 15, wherein the metal chalcogenide based material comprises at least one metal element selected from the group consisting of Mo, W, Nb, V, Ta, Ti, Zr, Hf, Tc, Re, Cu, Ga, In, Sn, Ge, and Pb and at least one chalcogen element selected from the group consisting of S, Se, and Te.

18. An electronic device comprising:
    a substrate, a source and a drain that are formed on the substrate, a gate insulating layer and a gate electrode that are formed on the substrate between the source and the drain;
    an insulating layer that is formed on the source and the drain and comprises openings that respectively expose the source and the drain;
    a graphene layer and an adhesion layer that are formed on sidewalls of the openings; and
    a source electrode and a drain electrode that are formed in the adhesion layer and are respectively electrically connected to the source and the drain.

19. The electronic device of claim 18, wherein the adhesion layer comprises at least one metal element selected from the group consisting of Mo, W, Nb, V, Ta, Ti, Zr, Hf, Tc, Re, Cu, Ga, In, Sn, Ge, and Pb and at least one chalcogen element selected from the group consisting of S, Se, and Te.

20. The electronic device of claim 18, wherein the adhesion layer comprises BN.

* * * * *